United States Patent [19]
Gardner et al.

[11] Patent Number: 5,770,517
[45] Date of Patent: Jun. 23, 1998

[54] SEMICONDUCTOR FABRICATION EMPLOYING COPPER PLUG FORMATION WITHIN A CONTACT AREA

[75] Inventors: Mark I. Gardner, Cedar Creek; Fred N. Hause, Austin, both of Tex.

[73] Assignee: Advanced Micro Devices, Inc., Sunnyvale, Calif.

[21] Appl. No.: 823,046

[22] Filed: Mar. 21, 1997

[51] Int. Cl.[6] .................. H01L 21/265; H01L 21/283
[52] U.S. Cl. .................. 438/627; 438/628; 438/659; 438/687
[58] Field of Search .................. 438/520, 528, 438/533, 625, 626, 627, 628, 629, 630, 677, 687, 659, 158

[56] References Cited

U.S. PATENT DOCUMENTS

| | | | |
|---|---|---|---|
| 4,910,169 | 3/1990 | Hoshino | 257/741 |
| 4,931,410 | 6/1990 | Tokunaga et al. | 438/627 |
| 5,102,826 | 4/1992 | Ohshima et al. | 438/528 |
| 5,391,517 | 2/1995 | Gelatos et al. | 438/687 |
| 5,478,780 | 12/1995 | Koerner et al. | 438/653 |

FOREIGN PATENT DOCUMENTS

| | | | |
|---|---|---|---|
| 1-82620 | 3/1989 | Japan | 438/158 |

OTHER PUBLICATIONS

Tsai, W., et al., "Effect of Electron Cyclotron Resonance $H^+$, $Ne^+$, $Ar^+$, and $Xe^+$...", IEEE Trans. Elec. Dev., vol. 41, No. 8, Aug. 1994, pp. 1396–1404.

Rausch, W., et al., "Palladium Silicide Contact Resistance Stabilization...", IBM Tech. Disc. Bull., 27(7A), Dec. 1981, p. 3453.

Primary Examiner—T. N. Quach
Attorney, Agent, or Firm—Kevin L. Daffer; Conley, Rose & Tayon

[57] ABSTRACT

An integrated circuit fabrication process is provided in which copper is used as the contact plug material for a via. The via is a hole etched through an interlevel dielectric which is disposed upon a semiconductor topography, e.g., a silicon-based substrate having junctions therein. An inert implant may form an implant region within the semiconductor topography lying underneath the via. The process for forming the copper plug involves depositing a diffusion barrier upon the interlevel dielectric and within the via. Copper is then deposited via chemical vapor deposition upon the diffusion barrier such that the copper fills the entire via and forms a layer above the via. The copper is etched from all areas except from within the via, thereby forming a copper plug in the via. The resulting surface is then subjected to chemical-mechanical polishing before the diffusion barrier is removed from areas exclusive of the via. A conductive layer can be placed upon the interlevel dielectric and the copper plug to form a contact between the conductive layer and the semiconductor topography.

16 Claims, 2 Drawing Sheets

SEMICONDUCTOR FABRICATION EMPLOYING COPPER PLUG FORMATION WITHIN A CONTACT AREA

BACKGROUND OF THE INVENTION

1. Field of the Invention

This invention relates to integrated circuit fabrication and, more particularly, to a copper-based plug formed in a contact area of the integrated circuit to enhance overall contact conductivity.

2. Description of the Relevant Art

Fabrication of an integrated circuit involves numerous processing steps. Using openings ("vias") to connect one conductive layer to another is well known in the art. Vias are generally formed through an insulating material disposed between conductive layers. Since minimum feature sizes of conventional integrated circuits have become more popular in industry, vias having substantially vertical sidewalls are desirable because they require less space. However, when physical vapor deposition is performed to deposit metal over vias, vertical sidewalls cause step coverage problems. Step coverage is defined as a measure of how well a film conforms over an underlying step. In this instance, step coverage over relatively vertical sidewalls of a via is problematic relative to sloped sidewalls. Step coverage is often measured as a ratio of the minimum thickness of a film as it crosses a step to the nominal thickness of the film on horizontal regions. It is desired that step coverage be a large value, however, step coverage above 0.5 seems adequate in most fabrication processes. A via having a greater depth to width ratio ("aspect ratio") results in smaller step coverage of a conductive film deposited across the via. In order to implement a vertical sidewall, the via generally must be filled with a conductive material which readily flows or conforms to the via topography.

A metal deposited by chemical vapor deposition ("CVD") allows such conformance, and produces what is generally referred to in the industry as a metal "plug" formed exclusively in the via. Plug material is chosen so that it fills the via to a height commensurate with the adjacent dielectric surface. Subsequently deposited films will therefore not have to content with severe steps of the underlying surface adjacent the via.

Tungsten is at least one of the more popular plug materials. Two CVD tungsten methods have been developed for filling vias. In one method, tungsten is selectively deposited from $WF_6$ which can be reduced by silicon, hydrogen, or silane. When hydrogen reduction is used, selectivity occurs at a temperature below which the insulating material does not catalyze hydrogen dissociation, but at which other surfaces, e.g., silicon, metal, or silicide catalyze the dissociation. At a temperature below about 500° C., tungsten may be selectively deposited upon only the bottom of a via. One limitation of the hydrogen reduction process is that hydrogen fluoride gas is a by-product which is believed to be responsible for junction leakage. The junction leakage is caused by lateral encroachment under the adjacent dielectric (i.e., oxide) and by tiny holes formed within the oxide.

Problem of selective CVD are overcome, to some degree, by a blanket CVD and etchback technique. Despite the added processing steps and the material waste involved in depositing and thereafter removing sacrificial portions of tungsten, blanket deposit/etchback has become a processing mainstay. Blanket CVD involves forming an adhesion layer, e.g., titanium or titanium nitride upon the base and sidewalls of the via. This adhesion layer is necessary since tungsten deposited by CVD does not adhere well to most dielectrics. Then a layer of tungsten is deposited onto the entire surface of the semiconductor topography, and especially into the via. The tungsten is then removed in areas exclusive of the via, thereby creating a tungsten plug.

Tungsten plugs readily bond with the underlying titanium silicide. There are several problems that can result from using CVD of tungsten to form plugs within the vias. A $TiF_3$ layer often forms at the tungsten/titanium silicide interface when selective deposition of tungsten is performed in a hotwall process at 300°–350° C. This layer causes contact resistance between the plug and the underlying silicide to increase relative to not having a $TiF_3$ layer therebetween. Tungsten depositions at 600°–700° C. exhibit a lower contact resistance than at the lower temperature process, but some contacts formed this way demonstrate lateral outgrowth or migration of the tungsten near the base of the dielectric.

Aluminum plugs are also fairly common. However, aluminum often exhibits problems of electromigration. Electromigration is defined as the motion of ions in response to the passage of current. The ionic flux which occurs during electromigration of aluminum causes an accumulation of vacancies, forming a void within the metal. Such voids may become so large that an open-circuit failure of the conductor may occur. Furthermore, electromigration can occur as a result of current flow through an area near the silicon/aluminum interface. This involves silicon atoms moving along the grain boundaries of the aluminum plug, causing the formation of voids in the underlying silicon. Aluminum can fill the voids, leading to localized areas of the plug void of aluminum (i.e., an open circuit failure), or to aluminum extending downward through the underlying junction (i.e., junction spiking). Tungsten is more resistant to electromigration than aluminum, but electromigration of tungsten is still a problem. Resistivity of a metal increases when electromigration occurs because voids form through which charged carriers cannot pass.

Another problem resulting from using aluminum as a contact plug is that hillock formation often occurs in aluminum. Hillocks are spike-like projections that protrude from the plug surface in response to a state of compressive stress in the film. One reason for hillock formation in aluminum is that the thermal coefficient of expansion of aluminum is much larger than that of silicon. When a silicon wafer is heated, overlying aluminum desires to expand more than is allowed by the underlying wafer topography. A compressive stress in the aluminum increases as a function of temperature. Hillock growth also results from vacancy migration within a metal having a vacancy-concentration gradient. As discussed previously, aluminum exhibits electromigration which can cause this type of gradient. The rate of diffusion of vacancies increases as temperature increases. Hillocks can lead to interlevel shorting when they penetrate a dielectric layer adjacent a via and make contact with the next level of metal.

SUMMARY OF THE INVENTION

The problems outlined above are in large part solved by the fabrication process of the present invention. That is, a process is provided that provides a highly conductive plug. Preferably the plug material is made of copper which exhibits less susceptibility to electromigration. Moreover, hillock formation the copper plug is relatively small compared to conventional plug materials.

According to one embodiment of the present invention, an interlevel dielectric is deposited upon a semiconductor topography. For example, the topography comprises a doped silicon substrate. A via is patterned through the interlevel dielectric. The via preferably has relatively vertical sidewalls which extend perpendicular to the topological surface the entire thickness of the interlevel dielectric. An inert material is preferably implanted into the semiconductor topography void of interlevel dielectric. The inert material is forwarded as ions which disrupt the silicon substrate at the exposed base of the via. The concentration of forwarded ions as well as the energy used for implantation are preferably at amounts which allow a portion of the silicon substrate at the exposed base of the via to amorphize or become devoid of long-range periodic structure. Within the amorphized region of the silicon substrate, the number of stably displaced silicon atoms reaches at least the number of silicon atoms per unit volume.

A diffusion barrier may be formed upon the surface of the interlevel dielectric such that the silicon substrate at the base of the via is covered with the diffusion barrier. Copper is then deposited upon the partially amorphized substrate, or upon the diffusion barrier. The deposited copper accumulates within the via to an elevational level above the adjacent interlevel dielectric surface. Copper upon the dielectric surface is then removed, preferably using a chemical mechanical polish ("CMP"). Copper which remains exclusively within the via forms a copper plug. The copper material is defined as that which is "copper-based". In other words, the copper material may contain other alloys, for example, silicon, with copper being prevalent throughout the plug.

Copper is removed so that the plug upper surface is at approximately the same planar level as the dielectric surface. Thus, CMP serves to planarize the plug surface substantially equal to the neighboring surfaces. Once copper is removed from the dielectric surface, the diffusion barrier is exposed over the dielectric. The diffusion barrier can be removed using a selective etch process such as, for example, a wet etch/clean sequence. After removing the diffusion barrier, another conductive layer may be patterned upon a portion of the interlevel dielectric. The copper plug thereby serves as an intermediary between the overlying conductive layer and an underlying conductive layer (or doped conductive region) such that the layers are brought in electrical communication only in the contact region.

The present invention exhibits advantageous features compared to conventional methods of semiconductor fabrication. Copper is more resistant to electromigration than both tungsten and aluminum. Therefore, using copper as a plug material of a via results in less integrated circuit failures due to void formation. Copper also has a lower thermal coefficient than aluminum, and copper exhibits less vacancy migration. All of these factors help minimize hillock formation in copper as compared to that in conventional plugs. Since hillock structures can cause shorting within an integrated circuit, using a copper plug is very beneficial. Furthermore, copper exhibits better conductivity than tungsten and aluminum which means that it is less resistant to the movement of charged carriers therethrough. Yet further, the barrier layer or the partially amorphized silicon serve to help adhere copper to the underlying silicon-based material. Not only does it serve as a glue layer, but the barrier also prevents unwanted intermingling of atomic species thereacross. If needed, the barrier layer can be combined with an underlying amorphized silicon to enhance adhesion between copper and silicon. The copper can be deposited with silicon to further aid in adhesion.

BRIEF DESCRIPTION OF THE DRAWINGS

Other objects and advantages of the invention will become apparent upon reading the following detailed description and upon reference to the accompanying drawings in which:

FIG. 2b is a cross-sectional view of the semiconductor topography, wherein a diffusion barrier is formed within the via, subsequent to the steps in FIGS. 1 or 2a.

FIG. 3a is a cross-sectional view of the semiconductor topography, wherein copper is blanket deposited into the via and across the interlevel dielectric, subsequent the step in FIG. 2a.

Figure 1:
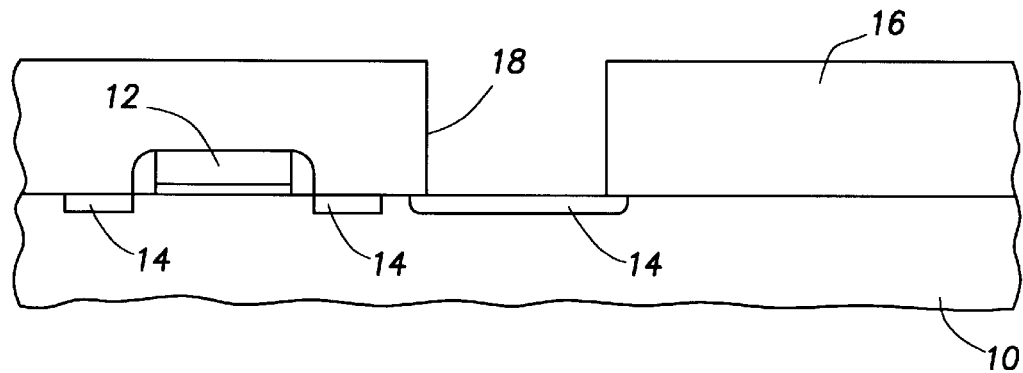
FIG. 1 is a cross-sectional view of a semiconductor topography comprising features formed upon and within the topography, and wherein a dopant area feature may be exposed by a via formed through an interlevel dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a cross-section of a semiconductor topography 10 having numerous features formed upon and within topography 10. Those feature comprise deposition and implant areas, patterned dielectric and conductive films, etc. According to one embodiment, topography 10 may consist of a silicon-based substrate having a gate conductor 12 patterned between a pair of junctions 14.

Deposited upon topography 10 is an interlevel dielectric 16. Dielectric 16 prevents electrical coupling between features within topography 10 and conductors upon dielectric 16 except in the region of via 18. Interlevel dielectric 16 is preferably composed of silicon dioxide but may be composed of other insulating materials as well. Various methods may be used to form interlevel dielectric 16, including deposition of an oxide-based material. Via 18 is formed vertically through interlevel dielectric 16 by selectively etching a portion of interlevel dielectric 16. A plasma etch routine can be used to form the vertical sidewall surfaces. For example, plasma etch can take place in a parallel plate reactor using an ion-assisted reactant.

Two embodiments of the present invention are illustrated. One embodiment relates to the steps shown in FIGS. 2a and 3a, while the other embodiment relates to the steps depicted in FIGS. 2b and 3b. It is understood that the embodiments can possibly be combined to produce an altogether different result which falls within the scope of the present invention.

Figure 2A:
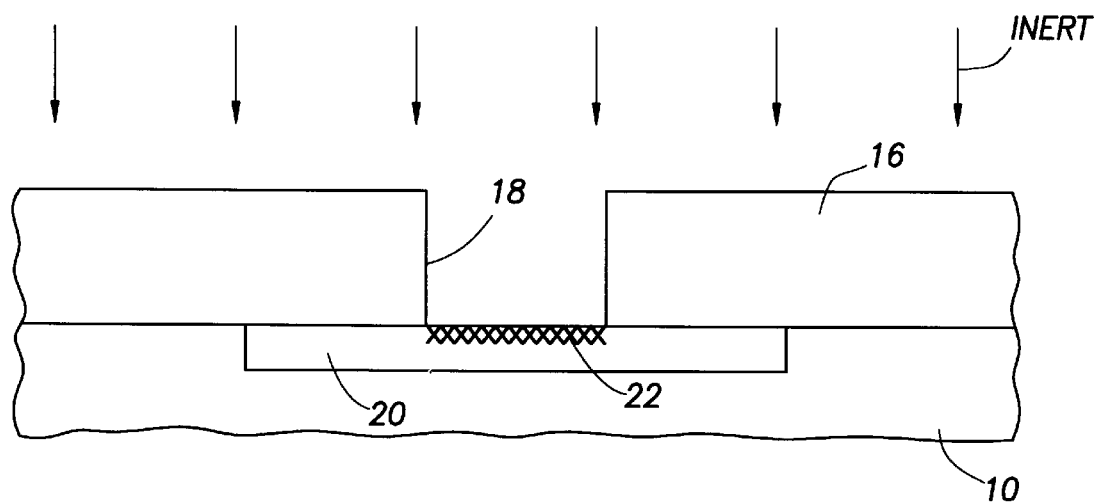
FIG. 2a is a cross-sectional view of the semiconductor topography, wherein an inert species is forwarded into the dopant area exposed by the via, subsequent the step in FIG. 1.

FIG. 2a illustrates semiconductor topography 10 as possibly being a dielectric having a localized conductive area exposed by via 18. As such, topography 10 is defined as any surface upon which accommodates a conductive film or dopants to which via 18 can be patterned. Topography 10 can therefore be a dielectric or semiconductive material having a region 20 arranged upon or within topography 10. In accordance with one embodiment of the present invention, semiconductor topography 10 undergoes implantation with an inert species to form region 22 directly beneath via 18. The inert species may include silicon, germanium, nitrogen, or argon. Implant region 22 has inert atoms intermingled with pre-existing conductive-type atoms of region 20. According to one embodiment, region 20 comprises a junction formed within a silicon-based topography. The inert atoms preferably "stuff" the grain-boundary diffusion paths of junction 20 and fill any vacancies therein. The concentration and implant energies used to forward inert atoms serve two important functions. First, the inert atoms disrupt (partially "amorphize") the silicon lattice to aid in bonding of copper or barrier material to the lattice. Amorphization appears to cause bond opportunities near the surface of region 20 to which copper or barrier atoms migrate. Intermingling of atoms at the disruption site serves to enhance adhesion of the plug to the underlying conductor. Second, the energy and concentration by which the inert atoms are forwarded help prevent metal atoms later from migrating entirely through region 20. Thus, implantation density is chosen so that at least partial amorphization occurs. However, the implant energy is chosen so that the peak concentration density is less than one third the depth of region 20. Since diffusion of metal atoms into junction 20 are controlled, atoms within junction 20 are prevented from diffusing into voids of the metal, and vice versa. Absent a controlled amorphized depth, metal atoms might diffuse into junction 20 well beyond the thickness of the junction. This could lead to "junction spiking" and eventual current leakage or electrical shorting.

Figure 2B:
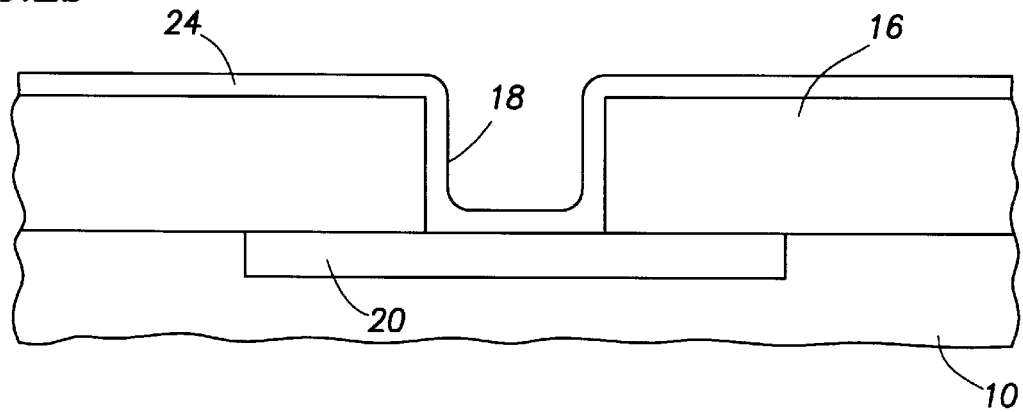

FIG. 2b illustrates absence of implant area 22, according to an alternative embodiment. While not preferred, foregoing the implant area can enhance the fabrication throughput. Absent the implant area implies a diffusion layer 24 which is carefully controlled so as not to migrate through junction 20. If the diffusion barrier material is chosen so that it does not overly migrate, diffusion barrier 24 might be all that is needed as both a glue layer and a layer which avoids spiking problems.

Figure 3A:
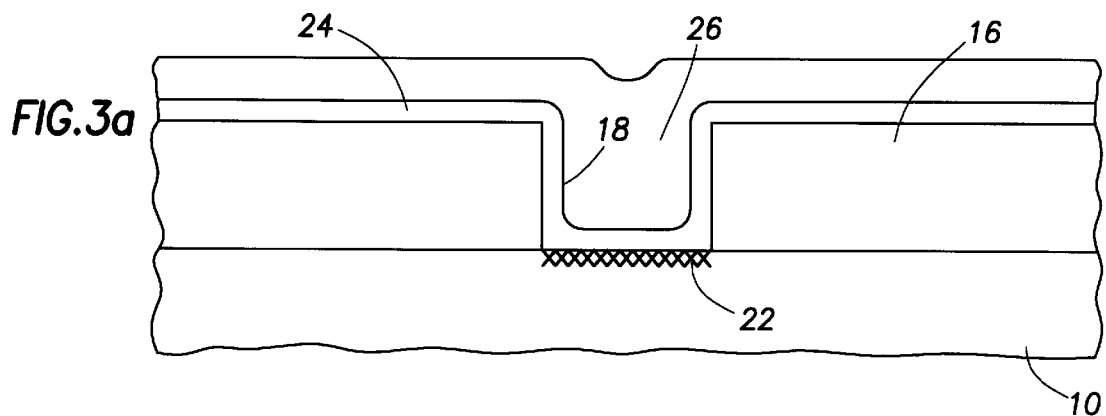

FIG. 3a depicts diffusion barrier 24 and a copper layer 26 upon semiconductor topography 10 having implant region 22. Diffusion barrier 24 is placed prior to copper deposition. Diffusion barrier 24 may include titanium nitride, titanium, tantalum, tantalum nitride, or any combination thereof. Diffusion barrier 24 forms a separate layer which helps prevents metal atoms from diffusing into junction 20 and spiking the junction. FIG. 2b also depicts the formation of diffusion barrier 24. However, diffusion barrier 24 of FIG. 2b is formed upon a semiconductor topography 10 which has no inert implantation region. Thus, one main difference between the two embodiments of this invention is that one embodiment involves an inert implantation while the other embodiment does not.

Diffusion barrier 24 is preferably deposited using CVD. Likewise copper 26 is preferably deposited using CVD. Copper is chosen not only for its high conductivity, but also due to its ability to flow (i.e., conform) similar to the underlying barrier material. Barrier material readily flows over the relatively sharp via corners and, likewise, so does copper.

Figure 3B:
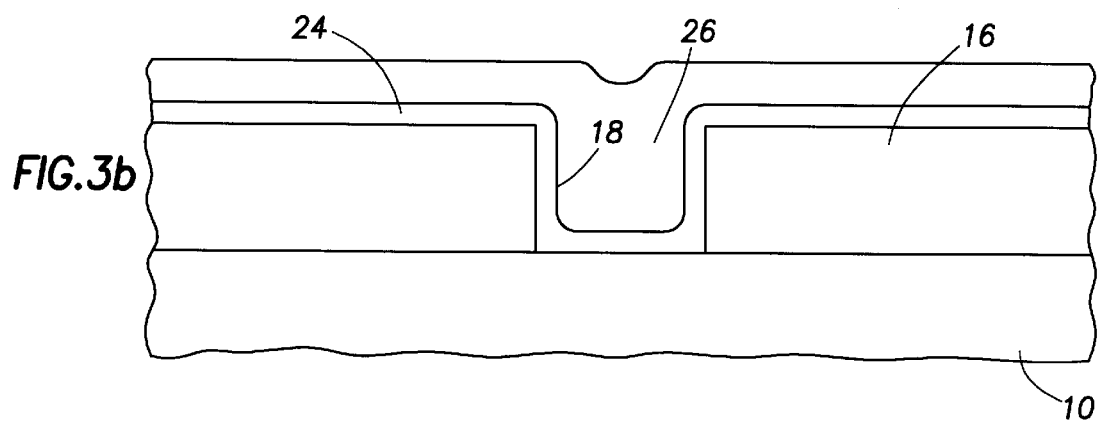
FIG. 3b is a cross-sectional view of the semiconductor topography, wherein copper is deposited into the via and across the diffusion barrier, subsequent the step in FIG. 2b.

FIG. 3b depicts the formation of copper 26 upon semiconductor topography 10, the copper layer 26 being deposited subsequent to the step depicted in FIG. 2b. Copper layer 26 in both embodiments of this invention is blanket deposited onto the entire surface of semiconductor topography 10. Copper fills via 18 and forms a layer upon barrier 24. CVD of copper provides better step coverage than a physical vapor deposition or sputtering. This advantage is needed to provide suitable thickness at the vertical via sidewalls. Adequate step coverage using physical vapor deposition is usually possible if the aspect ratio of the via opening is less than 0.25, however, other factors also determine what is adequate step coverage, such as the current density passing through the metal. Due to the many factors which affect step coverage, it may be difficult to determine a minimum value of step coverage needed to make a contact suitably operate.

Figure 4:
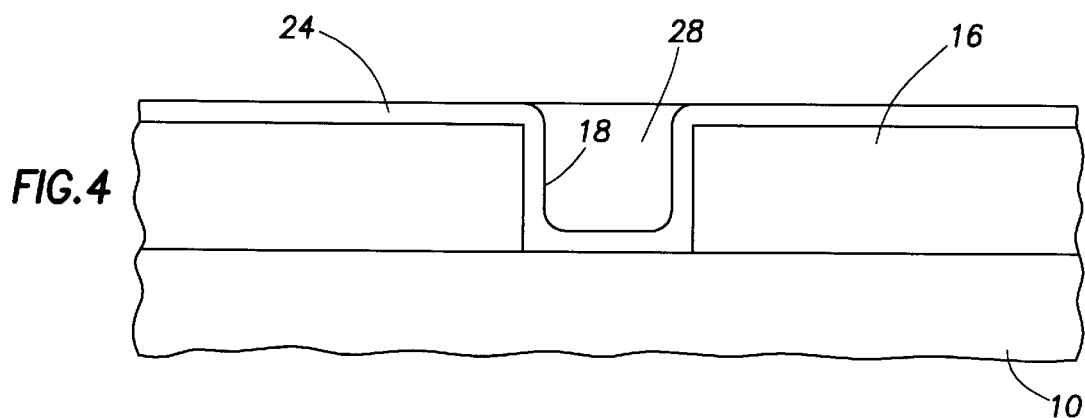
FIG. 4 is a cross-sectional view of the semiconductor topography, wherein a portion of the copper layer is removed to form a copper plug subsequent the step in FIG. 3a or 3b.

FIG. 4 depicts the formation of a copper plug 28 within via 18 and represents a step which culminates plug formation hereof. Copper plug 28 is formed by removing portions of copper layer 26 (shown in FIGS. 3a and 3b) exclusive of via 18. For example, copper 26 is cleared from the interlevel dielectric surface using CMP. Alternatively, copper can be cleared using a lithography step, followed by selective etch. Regardless of the chosen methodology, the copper is chosen to remain only within via 18. The surface of copper plug 28 is commensurate with the adjacent interlevel dielectric surface so that a planarized surface is presented to subsequently deposited films used in forming a multi-level integrated circuit.

Figure 5:
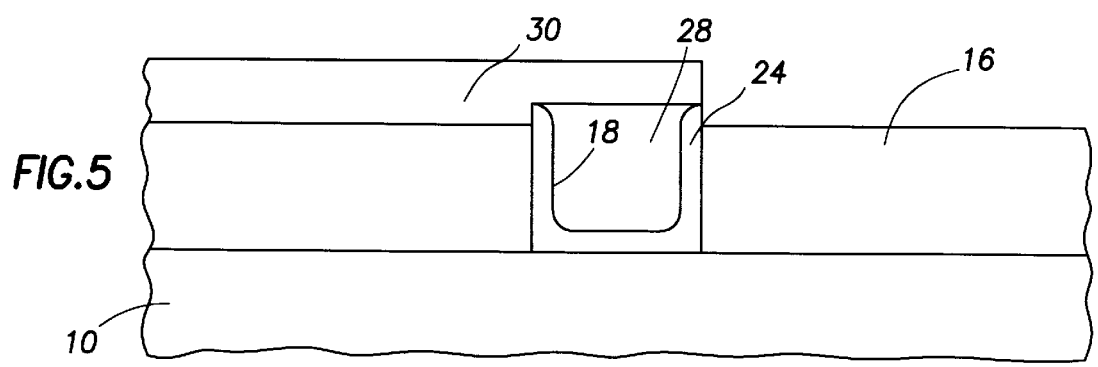
FIG. 5 is a cross-sectional view of the semiconductor topography, wherein a portion of the diffusion barrier is removed and a conductive material is formed upon the resulting topography to complete a multi-level interconnect structure hereof.

FIG. 5 illustrates the removal of barrier layer 24 (shown in FIG. 4) in all areas except where barrier layer 24 contacts copper plug 28. This barrier layer 24 may be removed using a wet-etch which reacts exclusively with the material which composes barrier layer 24. Furthermore, a conductive material, e.g., aluminum 30 is deposited upon a portion of interlevel dielectric 28. Aluminum 30 is also disposed upon copper plug 28 so that copper plug 28 forms a contact between semiconductor topography 10 and aluminum 30.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming an integrated circuit, comprising:
   providing an interlevel dielectric disposed upon a semiconductor topography;
   removing a portion of the interlevel dielectric to form a via extending to a contact region of the semiconductor topography;
   implanting inert species through the via at an energy and concentration density sufficient to at least partially amorphize the contact region;

depositing copper within the via and upon the interlevel dielectric; and removing said copper exclusive of said via.

2. The method as recited in claim 1, wherein said interlevel dielectric comprises an oxide.

3. The method as recited in claim 1, wherein said via extends entirely through said interlevel dielectric to said semiconductor topography.

4. The method as recited in claim 1, wherein said semiconductor topography comprises a doped silicon-based substrate.

5. The method as recited in claim 1, wherein said semiconductor topography comprises a conductor patterned upon a dielectric material.

6. The method as recited in claim 1, wherein said removing said copper comprises chemical mechanical polishing.

7. The method as recited in claim 1, further comprising forming a conductor upon the remaining said copper.

8. The method as recited in claim 1, wherein said inert species comprises atomic silicon, germanium, argon or nitrogen.

9. The method as recited in claim 1, wherein said copper comprises silicon.

10. A method for forming a contact structure of an integrated circuit, comprising:

providing an interlayer dielectric disposed upon a topological surface, the interlevel dielectric having a via extending through the interlevel dielectric perpendicular to the topological surface;

amorphizing the topological surface exposed by said via;

depositing a diffusion barrier upon said amorphized topological surface and said interlevel dielectric;

depositing copper upon said diffusion barrier; and removing said copper in areas exclusive of said via, thereby forming a copper plug bounded within said via.

11. The method as recited in claim 9, wherein said interlevel dielectric comprises an oxide.

12. The method as recited in claim 9, wherein said via extends to said topological surface.

13. The method as recited in claim 9, wherein said topological surface comprises a surface of single crystalline silicon or a surface of a conductive layer.

14. The method as recited in claim 9, wherein said removing said copper comprises polishing or etching.

15. The method as recited in claim 9, wherein said amorphizing comprises implanting inert ions into said topological surface such that a majority of pre-existing atoms are displaced from the initial position.

16. The method as recited in claim 14, wherein said majority comprises greater than 50 percent.

* * * * *

UNITED STATES PATENT AND TRADEMARK OFFICE
CERTIFICATE OF CORRECTION

PATENT NO.   : 5,770,517
DATED        : June 23, 1998
INVENTOR(S)  : Mark I. Gardner, et. al.

It is certified that error appears in the above-identified patent and that said Letters Patent is hereby corrected as shown below:

```
Claim 11, col. 8, line 9, please substitute the number 10 in place of 9.
Claim 12, col. 8, line 11, please substitute the number 10 in place of 9.
Claim 13, col. 8, line 13, please substitute the number 10 in place of 9.
Claim 14, col. 8, line 16, please substitute the number 10 in place of 9.
Claim 15, col. 8, line 18, please substitute the number 10 in place of 9.
Claim 16, col. 8, line 22, please substitute the number 15 in place of 14.
```

Signed and Sealed this

Twenty-second Day of September, 1998

Attest:

BRUCE LEHMAN

*Attesting Officer*     *Commissioner of Patents and Trademarks*